(12) United States Patent
Lee

(10) Patent No.: US 11,869,857 B2
(45) Date of Patent: Jan. 9, 2024

(54) SEMICONDUCTOR PACKAGE COMPONENT

(71) Applicant: AMOSENSE CO., LTD., Chungcheongnam-do (KR)

(72) Inventor: Ji-Hyung Lee, Chungcheongnam-do (KR)

(73) Assignee: Amosense Co., Ltd., Chungcheongnam-Do (KR)

( * ) Notice: Subject to any disclaimer, the term of this patent is extended or adjusted under 35 U.S.C. 154(b) by 274 days.

(21) Appl. No.: 17/413,403

(22) PCT Filed: Nov. 29, 2019

(86) PCT No.: PCT/KR2019/016726
§ 371 (c)(1),
(2) Date: Jun. 11, 2021

(87) PCT Pub. No.: WO2020/122482
PCT Pub. Date: Jun. 18, 2020

(65) Prior Publication Data
US 2022/0045023 A1 Feb. 10, 2022

(30) Foreign Application Priority Data

Dec. 11, 2018 (KR) .................. 10-2018-0159062
Dec. 11, 2018 (KR) .................. 10-2018-0159112

(51) Int. Cl.
*H01L 23/66* (2006.01)
*H01L 21/48* (2006.01)
(Continued)

(52) U.S. Cl.
CPC .......... *H01L 23/66* (2013.01); *H01L 21/4821* (2013.01); *H01L 23/15* (2013.01); *H01L 23/49575* (2013.01); *H01L 23/53228* (2013.01)

(58) Field of Classification Search
CPC ... H01L 23/66; H01L 23/15; H01L 23/49575; H01L 23/53228; H01L 21/4821
(Continued)

(56) References Cited

U.S. PATENT DOCUMENTS

2001/0038140 A1* 11/2001 Karker .................. H01L 23/057
257/E23.105
2010/0059271 A1 3/2010 Yoneda et al.
(Continued)

FOREIGN PATENT DOCUMENTS

EP 2056344 A1 5/2009
JP 2006-351826 A 12/2006
(Continued)

OTHER PUBLICATIONS

International Search Report for International Application No. PCT/KR2019/016726, dated Mar. 4, 2020, 5 pages with English Translation.
(Continued)

*Primary Examiner* — Quoc D Hoang
(74) *Attorney, Agent, or Firm* — TraskBritt

(57) ABSTRACT

A semiconductor package component and a semiconductor package including the same. More particularly, the present disclosure relates to a semiconductor package component for an RF power transistor and a semiconductor package including the same. Further particularly, it relates to a semiconductor package component for an RF power transistor and a semiconductor package including the same, capable of adjusting impedance matching of an RF transistor by connecting a die chip and a lead frame with a wire so that a length of the wire is reduced as much as the protruding height of the base substrate.

10 Claims, 4 Drawing Sheets

(51) Int. Cl.
*H01L 23/15* (2006.01)
*H01L 23/495* (2006.01)
*H01L 23/532* (2006.01)

(58) Field of Classification Search
USPC .......................................................... 257/676
See application file for complete search history.

(56) References Cited

U.S. PATENT DOCUMENTS

| | | | |
|---|---|---|---|
| 2011/0186983 A1 | 8/2011 | Hasegawa | |
| 2013/0307132 A1* | 11/2013 | Kawabata | H01L 23/49541 |
| | | | 257/676 |

FOREIGN PATENT DOCUMENTS

| | | | |
|---|---|---|---|
| KR | 2003-0028462 A | 4/2003 | |
| KR | 10-2012-0031681 A | 4/2012 | |
| KR | 10-2013-0113795 A | 10/2013 | |
| KR | 10-2015-0039759 A | 4/2015 | |
| KR | 10-2015-0049967 A | 5/2015 | |
| KR | 10-2015-0108683 A | 9/2015 | |
| KR | 10-2017-0008695 A | 1/2017 | |
| KR | 10-2017-0032618 A | 3/2017 | |
| WO | 01/78109 A2 | 10/2001 | |
| WO | 2006/097893 A2 | 9/2006 | |
| WO | 2008/013279 A1 | 12/2009 | |

OTHER PUBLICATIONS

International Written Opinion for International Application No. PCT/KR2019/016726, dated Mar. 4, 2020, 8 pages with English Translation.

Korean Notice of Reasons for Rejection for Korean Application No. 10-2022-0123659, dated Oct. 6, 2022, 7 pages with English translation.

European Extended Search Report and Opinion for European Application No. 19895728.4, dated Jan. 7, 2022, 11 pages.

Korean Notice of Reasons for Rejection for Korean Application No. 10-2018-0159062, dated Jan. 20, 2022, 7 pages with English translation.

Korean Notice of Reasons for Rejection for Korean Application No. 10-2018-0159112, dated Jan. 21, 2022, 9 pages with English translation.

* cited by examiner

SEMICONDUCTOR PACKAGE COMPONENT

CROSS-REFERENCE TO RELATED APPLICATIONS

This application is a national phase entry under 35 U.S.C. § 371 of International Patent Application PCT/KR2019/016726, filed Nov. 29, 2019, designating the United States of America and published as International Patent Publication WO 2020/122482 A1 on Jun. 18, 2020, which claims the benefit under Article 8 of the Patent Cooperation Treaty to Korean Patent Application Serial No. 10-2018-0159062, filed Dec. 11, 2018 and Korean Patent Application Serial No. 10-2018-0159112, filed Dec. 11, 2018.

TECHNICAL FIELD

The present disclosure relates to a semiconductor package component, a base substrate for an RF transistor, and a method for manufacturing the same. More particularly, it relates to a base substrate for an RF transistor formed with a protrusion and a method for manufacturing the same. More particularly, it relates to a semiconductor package component, a base substrate for an RF transistor, and a manufacturing method thereof capable of adjusting impedance matching of an RF transistor by connecting a die chip and a lead frame with a wire so that a length of the wire is reduced as much as the protruding height of the base substrate.

BACKGROUND

A semiconductor packaged RF power device typically includes a die chip mounted on a base and mounted within a semiconductor package. An RF input signal is provided to a transistor through an RF input lead extending from outside the package into the package, and an RF output signal is transmitted from the device through an RF output lead extending from inside the package to an outside.

Related technology 1 discloses an electronic RF device and a manufacturing method thereof in which an operating bandwidth, power efficiency, etc. is controlled by correcting a parasitic capacitance of a transistor with an electrical signal passing through an input lead and an output lead.

Related technology 2 discloses a packaged RF transistor device that includes an RF input lead and RF output lead coupled to an RF transistor cell, and a coupled output matching network. The upper capacitor plate of a capacitor is coupled to the output terminal of the RF transistor cell to provide impedance matching to the input of the transistor at the fundamental operating frequency of the transistor.

Related technology 3 discloses a substrate for a high-frequency semiconductor and a manufacturing method thereof in which a thermal expansion coefficient and an insulator insulating between a lead frame and a substrate are substantially the same, and at the same time heat dissipation effect is improved with high thermal conductivity.

However, in the conventional base substrate for an RF power transistor, a metal base is formed in a flat plate, and thus there is a limit to impedance matching during wire bonding in the transistor. Accordingly, there is a demand for development for extending an RF bandwidth.

The matters described in the above background art are intended to help the understanding of the background of the present disclosure, and may include matters that are not already known to those of ordinary skill in the art to which this technology belongs.

CITED LITERATURES (Patent Literature 1) Related technology 1: International Patent Laid-Open Publication WO2006/097893
(Patent Literature 2) Related technology 2: Korean Patent Laid-Open Publication KR2015-0039759
(Patent Literature 3) Related technology 3: Korean Patent Laid-Open Publication KR2017-0008695

BRIEF SUMMARY

Problem to be Solved

The present disclosure is considered to solve the above problems, and an object of the present disclosure is to provide a semiconductor package component, a base substrate for an RF transistor, and a manufacturing method thereof capable of adjusting the impedance matching of an RF transistor by mounting a die chip on the base substrate, forming a protrusion on the base substrate, mounting the die chip on the protrusion and connecting the die chip and a lead frame with a wire so that a length of the wire is reduced as much as a protruding height.

Solution to Problem

The present disclosure provides a semiconductor package component including: a base substrate; a ceramic layer formed on an upper portion of the base substrate; a lead frame formed on an upper portion of the ceramic layer; and a die chip mounted on the upper portion of the base substrate. A protrusion is formed on the base substrate, the die chip is mounted on the protrusion, and the die chip and the lead frame are connected with a wire.

The present disclosure provides a method of manufacturing a semiconductor package component including a first step of forming a ceramic layer on an upper portion of a base substrate; a second step of forming a lead frame on an upper portion of the ceramic layer; and a third step of mounting a die chip on the upper portion of the base substrate. A protrusion is formed on the base substrate, the die chip is mounted on the protrusion, and the die chip and the lead frame are connected with a wire.

In addition, as an example of the present disclosure, a semiconductor package component and a manufacturing method thereof in which the base substrate is a metal substrate are provided.

In addition, as an example of the present disclosure, a semiconductor package component and a manufacturing method thereof in which the base substrate is formed in a multi-layer structure are provided.

In addition, as an example of the present disclosure, a semiconductor package component and a manufacturing method thereof in which the base substrate formed in a multi-layer structure includes a first copper layer, a copper-molybdenum alloy layer formed on an upper portion of the first copper layer, and a second copper layer formed on the copper-molybdenum alloy layer are provided.

In addition, as an example of the present disclosure, a semiconductor package component and a manufacturing method thereof in which the protrusion is in integral with the base substrate are provided.

In addition, as an example of the present disclosure, a semiconductor package component and a manufacturing method thereof in which a height of the ceramic layer is 0.4 mm to 0.7 mm are provided.

In addition, as an example of the present disclosure, a semiconductor package component and a manufacturing method thereof in which a height of the protrusion is 0.2 mm to 0.6 mm are provided.

In addition, as an example of the present disclosure, a semiconductor package component and a manufacturing method thereof in which a height of the protrusion is lower than a height of the ceramic layer are provided.

In addition, as an example of the present disclosure, a semiconductor package component and a manufacturing method thereof in which when the height of the ceramic layer is r and the height of the protrusion is k, a ratio of r and k is 1:0.5 to 1:0.8 are provided.

In addition, as an example of the present disclosure, a semiconductor package component and a manufacturing method thereof in which the ceramic layer is formed in a shape that surrounds an outer periphery of the protrusion are provided.

In addition, as an example of the present disclosure, a semiconductor package component and a manufacturing method thereof in which an area of the protrusion is larger than an area of the die chip are provided.

In addition, as an example of the present disclosure, a semiconductor package component and a manufacturing method thereof in which the protrusion is not in contact with the ceramic layer are provided.

Next, the present disclosure provides a base substrate for an RF transistor made of a metal, including a protrusion provided on one side of the base substrate.

Another example of the present disclosure provides a base substrate for an RF transistor in which the base substrate is formed in a multi-layer.

Another example of the present disclosure provides a base substrate for an RF transistor in which the base substrate includes a base intermediate layer; a first metal layer provided on one surface of the base intermediate layer; and a second metal layer provided on the other surface of the base intermediate layer.

Another example of the present disclosure provides a base substrate for an RF transistor in which the base substrate has a thermal expansion coefficient of 4 to 9 ppm/° C. and a thermal conductivity of 140 to 240 W/m·K.

Another example of the present disclosure provides a base substrate for an RF transistor in which the base intermediate layer is a copper-molybdenum alloy layer, and the first metal layer and the second metal layer include a copper layer.

Another example of the present disclosure provides a base substrate for an RF transistor in which the first metal layer and the second metal layer have a melting structure in which the metal is melted and then re-hardened.

Another example of the present disclosure provides a base substrate for an RF transistor in which the protrusion is formed by welding or integrally with the base substrate.

The present disclosure provides a method of manufacturing a base substrate for an RF transistor made of metal, including forming a protrusion on one side of the base substrate.

Another example of the present disclosure provides a method of manufacturing a base substrate for an RF transistor in which the bae substrate is formed in a multi-layer.

Another example of the present disclosure provides a method of manufacturing a base substrate for an RF transistor in which the step of forming the base substrate in the multi-layer includes the steps of: preparing a base intermediate layer; and forming a metal layer by forming a first metal layer and a second metal layer on both surfaces of the base intermediate layer, respectively.

Another example of the present disclosure provides a method of manufacturing a base substrate for an RF transistor in which the base substrate has a thermal expansion coefficient of 4 to 9 ppm/° C. and a thermal conductivity of 140 to 240 W/m·K.

Another example of the present disclosure provides a method of manufacturing a base substrate for an RF transistor in which the base intermediate layer is a copper-molybdenum alloy layer, and the first metal layer and the second metal layer are a copper layer.

Another example of the present disclosure provides a method of manufacturing a base substrate for an RF transistor in which the first metal layer and the second metal layer have a melting structure in which the metal is melted and then re-hardened.

Another example of the present disclosure provides a method of manufacturing a base substrate for an RF transistor in which the protrusion is formed by welding or integrally with the base substrate.

Another example of the present disclosure provides a method of manufacturing a base substrate for an RF transistor in which the protrusion is formed by processing with an end mill.

Another example of the present disclosure provides a method of manufacturing a base substrate for an RF transistor in which the protrusion is formed by press processing.

Advantageous Effects of the Present Disclosure

According to the present disclosure, when connecting a die chip and a lead frame with a wire in a semiconductor package component, the length of the wire is reduced as much as the protruding height of the base substrate. Thus, the impedance matching of the RF transistor can be adjusted, and the RF transistor has excellent thermal conductivity, thermal expansion coefficient, and reliability.

DETAILED DESCRIPTION

In order to fully understand the present disclosure, the operational advantages of the present disclosure, and the objects achieved by the embodiment of the present disclosure, reference should be made to the accompanying drawings illustrating preferred embodiments of the present disclosure and the contents described in the accompanying drawings.

In describing preferred embodiments of the present disclosure, well-known techniques or repetitive descriptions that may unnecessarily obscure the gist of the present disclosure will be reduced or omitted.

Figure 1:
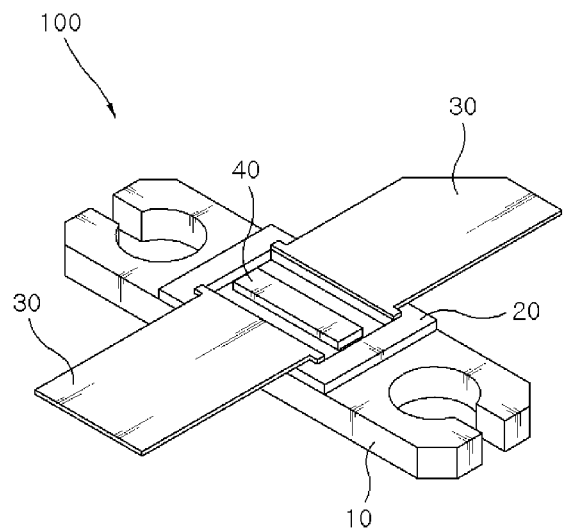
FIG. 1 shows a semiconductor package component of the present disclosure.

FIG. 1 shows a semiconductor package component of the present disclosure. As shown in FIG. 1, the semiconductor package component 100 of the present disclosure includes a base substrate 10, a ceramic layer 20 formed on the upper portion of the base substrate 10, and a lead frame 30 formed on the upper portion of the ceramic layer 20. In addition, in the semiconductor package component 100 of the present disclosure, a protrusion 40 may be formed on the upper portion of the base substrate 10.

Figure 2:
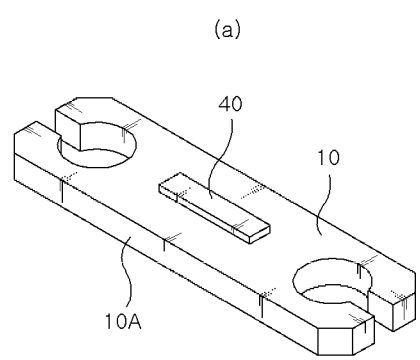
FIG. 2 shows a base substrate of the present disclosure.
Figure 2:
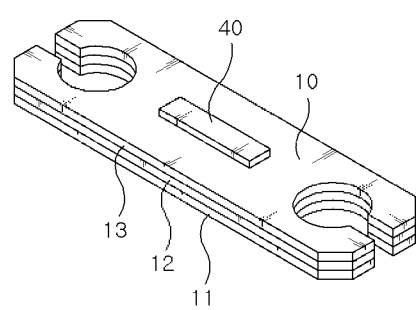

FIG. 2 shows an example of a base substrate of the present disclosure. The base substrate 10 may use a metal substrate. The metal substrate may be manufactured by casting any one of copper (Cu), silver (Ag), aluminum (Al), nickel (Ni), tin (Sn), and molybdenum (Mo), and alloys thereof or a mixture of other metals may also be used. For example, alloys such as TiCu, NiTi, TiCu, NiNb, CuMo, TiAg and the like may be used.

As shown in (a) of FIG. 2, a single layer structure 10A or a multi-layer structure may be used for the base substrate 10. In the case of a multi-layer structure, two or three more layers may be used, and as shown in (b) of FIG. 2, three-layer structures 11, 12, and 13 may be used.

The base substrate 10 may include a base intermediate layer 12; a first metal layer 11 provided on one surface of the base intermediate layer 12; and a second metal layer 13 provided on the other surface of the base intermediate layer 12.

The material of the base intermediate layer 12 may be any one of copper (Cu), aluminum (Al), silver (Ag), gold (Au), and molybdenum (Mo) or an alloy thereof, and the first metal layer 11 and the second metal layer 13 may be any one of copper (Cu), aluminum (Al), silver (Ag), gold (Au), molybdenum (Mo) or an alloy thereof, but the first metal layer 11 and the second metal layer 13 are preferably of the same type. In particular, when the base intermediate layer 12 is formed of a copper-molybdenum alloy layer, and the first metal layer 11 and the second metal layer 13 are formed of a copper layer, it has the effect of reducing the thermal expansion coefficient of the base substrate 10 and improving the thermal conductivity.

In addition, the thermal expansion coefficients of the first metal layer 11 and the second metal layer 13 are preferably smaller than that of the base intermediate layer 12, and the thermal conductivities of the first metal layer 11 and the second metal layer 13 are preferably smaller than that of the base intermediate layer 12. That is, preferably, the first metal layer 11 and the second metal layer 13 are formed of the metals whose thermal expansion coefficient and thermal conductivity are smaller than the thermal expansion coefficient and thermal conductivity of the base intermediate layer 12, and they are laminated on both surfaces of the base intermediate layer 12, respectively.

The base substrate 10 having the multi-layer structure is a metal substrate for satisfying a specific expansion rate, and as an example, there is a metal substrate having the thermal expansion coefficient of 4 to 9 ppm/° C. In addition, the metal substrate having the multi-layer structure according to the present disclosure is the base substrate 10 that satisfies a specific thermal conductivity as well as a specific expansion rate, and as an example, there is a metal substrate having a thermal conductivity of 140 to 240 W/m·K.

As an example, the first metal layer 11 and the second metal layer 13 are brazing bonded to the base intermediate layer 12 through a metal foil. For example, the first metal layer 11 and the second metal layer 13 may be bonded to the base intermediate layer 12 using a metal foil, or may be bonded by brazing using a deposition layer. The first metal layer 11 and the second metal layer 13 may have a re-melting structure in which the metal is melted, and then re-hardened.

The ceramic layer 20 of the present disclosure may be formed of any one ceramic material of Zirconia Toughened Alumina (ZTA), aluminum nitride (AlN), aluminum oxide ($Al_2O_3$), and silicon nitride (SiN, $Si_3N_4$). The ceramic layer 20 may use a synthetic ceramic material including at least one of ZTA, aluminum nitride, aluminum oxide, and silicon nitride. For example, the ceramic layer 20 may have a composition ratio of about 9% to 15% of ZTA and the remainder (about 85% to 91%) of at least one of aluminum nitride, aluminum oxide, and silicon nitride.

The ceramic layer 20 may be formed to have a thickness of about 0.4 mm to 0.7 mm depending on the composition ratio. In this case, a fine protrusion may be formed on the surface of the ceramic layer 20 through chemical or physical polishing in order to strengthen the bonding force with the base substrate 10.

The ceramic layer 20 may be formed in a shape that surrounds the outer periphery of the protrusion 40. According to the design of the semiconductor package component, it may be formed in a polygonal shape such as a circle, an ellipse, a square, a pentagon, etc.

The protrusion 40 of the present disclosure may be positioned in the center of the base substrate 10. The protrusion 40 may be bonded to the upper portion of the base substrate 10 by welding or the like.

Alternatively, the protrusion 40 may be processed integrally with the base substrate 10. For example, the second metal layer 13 and the protrusion 40 may be integrally processed. When the protrusion 40 and the base substrate 10 are integrally formed, the process of bonding the protrusion 40 to the base substrate 10 is omitted, thereby improving process efficiency and reducing the occurrence of errors due to welding.

As shown in (a) and (b) of FIG. 2, the protrusion 40 may have a tetrahedral shape. Alternatively, it may have a cylindrical shape, and may be appropriately used according to the semiconductor design.

Figure 3:
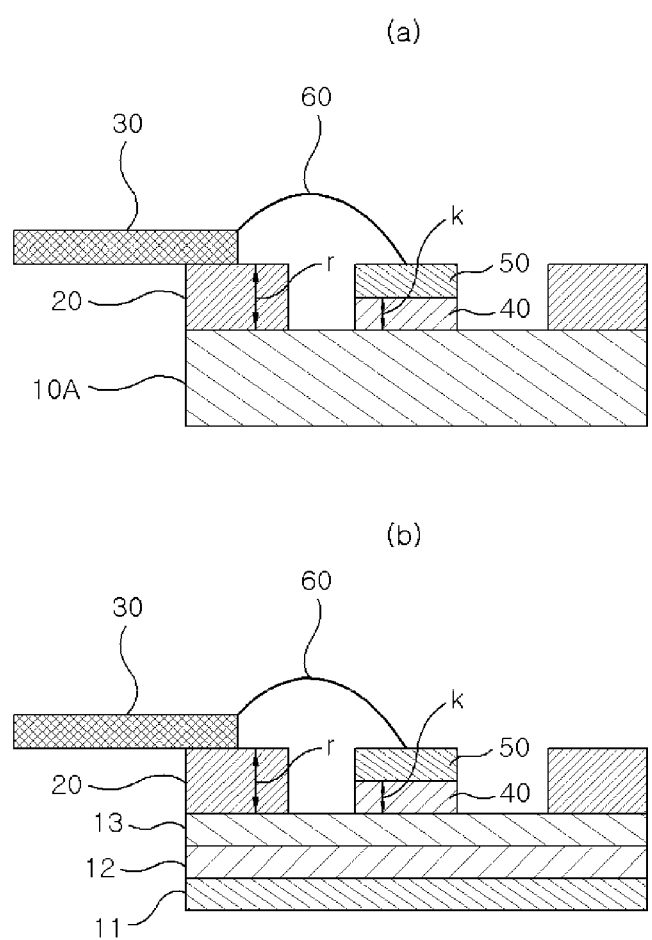
FIG. 3 shows a cross-sectional view of a semiconductor package component.

In FIG. 3, (a) is a cross-sectional view of a semiconductor package component in which a base substrate has a single layer structure, and (b) is a cross-sectional view showing a semiconductor package component in which a base substrate has a multi-layer structure.

The area of the protrusion 40 is shown to be the same as that of the die chip 50 in (a) and (b) of FIG. 3, but the area of the protrusion 40 may be larger than the area of the die chip 50. In terms of stably bonding the die chip 50 to the protrusion 40 and reducing an alignment error, the area of the protrusion 40 is more preferably larger than that of the die chip 50. However, when the protrusion 40 comes into contact with the ceramic layer 20, a short circuit is likely to occur, so it is preferable that the protrusion 40 does not contact the ceramic layer 20.

The height of the protrusion 40 may be formed to have a thickness of about 0.2 mm to 0.6 mm in consideration of the height difference with the ceramic layer 20. More preferably, it may be formed to have a thickness of 0.3 mm to 0.5 mm. In this case, the height of the protrusion 40 is preferably formed to be lower than the height of the ceramic layer 20. For example, when the height of the ceramic layer 20 is r and the height of the protrusion 40 is k, the ratio of r and k may be 1:0.5 to 1:0.8. The ratio of r and k is more preferably 1:0.6 to 1:0.7. If the ratio of r and k is less than 0.5, the effect of impedance matching during wire bonding of the transistor is small, and if the ratio of r and k exceeds 0.8, the possibility of a wire short increases.

The wire 60 electrically connects the die chip 50 and the lead frame 30, and may be formed of one or two or more alloys selected from platinum, gold, silver, copper, and the like.

In (a) and (b) of FIG. 3, one wire 60 is illustrated as connecting the die chip 50 and the lead frame 30. However, an RF input signal may be provided to the transistor through the RF input lead frame extending from the outside of the semiconductor package component to the inside of the semiconductor package component, and an RF output signal may be transmitted from the device through the RF output lead frame extending from the inside of the semiconductor package component to an outside.

The semiconductor package of the present disclosure may include a ceramic cover (not shown) for protecting the semiconductor package component 100. In addition, the semiconductor package of the present disclosure can be used for an RF transistor. The RF power transistor may be, for example, a metal-oxide semiconductor field-effect transistor (MOSFET), a lateral diffused metal-oxide semiconductor transistor (LDMOST), a bipolar junction transistor (BJT), a junction field-effect transistor (JFET), a heterojunction bipolar transistor (HBT), and the like. An RF power transistor can be used to generate RF power in an electronic RF device.

Figure 4:
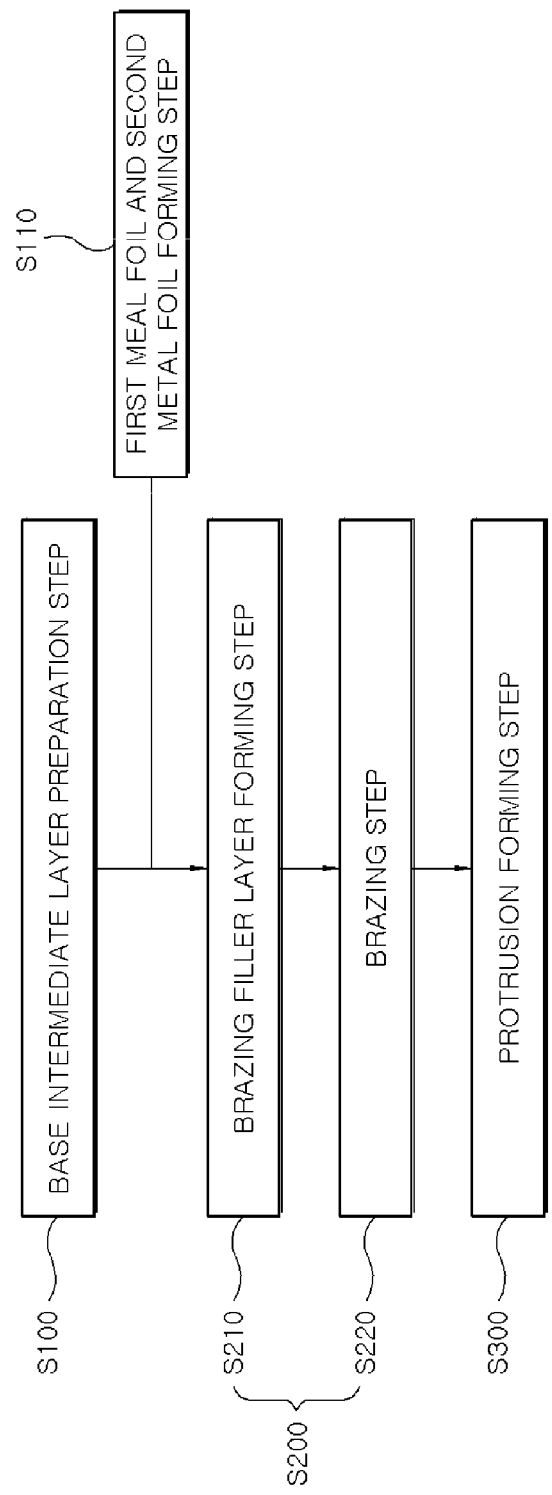
FIG. 4 shows a manufacturing example of a base substrate of the present disclosure.

Next, with reference to FIG. 4, a manufacturing example of the base substrate of the present disclosure will be described.

A base intermediate layer preparation step (S100) may be included. In addition, a multi-layered base substrate forming step may include the base intermediate layer preparation step; and a metal layer forming step (S200) in which a first metal layer and a second metal layer are formed on both surfaces of the base intermediate layer, respectively.

As an example, the base substrate forming step may further include a deposition step (S110) in which a first metal foil and a second metal foil made of a metal material having a smaller thermal expansion coefficient than that of the base intermediate layer are prepared, and a first deposition layer and a second deposition layer for brazing bonding are formed on one surface of the first metal foil and one surface of the second metal foil, respectively.

In addition, the metal layer forming step (S200) may include forming a brazing filler layer on both surfaces of the base intermediate layer, respectively (S210), and laminating and brazing the first metal foil and the second metal foil on both surfaces of the base metal substrate (S220).

Then, the protrusion of the present disclosure may be formed in the center of the base substrate (S300). The protrusion may be manufactured by boning to the second metal layer, which is the upper portion of the base substrate, by welding or the like, or may be manufactured by being processed integrally with the second metal layer of the base substrate. When the protrusion and the second metal layer of the base substrate are integrally manufactured, the process of bonding the protrusion to the second metal layer of the base substrate is omitted, thereby improving process efficiency and reducing the occurrence of errors due to welding.

In order to integrally manufacture the protrusion and the second metal layer of the base substrate, the protrusion may be formed on the second metal layer of the base substrate by pouring a molten metal into a mold having a concave portion, or may be formed by removing the remaining portions except the protrusion region in the second metal layer of the flat base substrate. For example, an end mill may be used to remove portions outside the protrusion region. Alternatively, a method of forming the protrusion by press processing using a method such as stamping is also advantageous in terms of processing within a short time.

Figure 5:
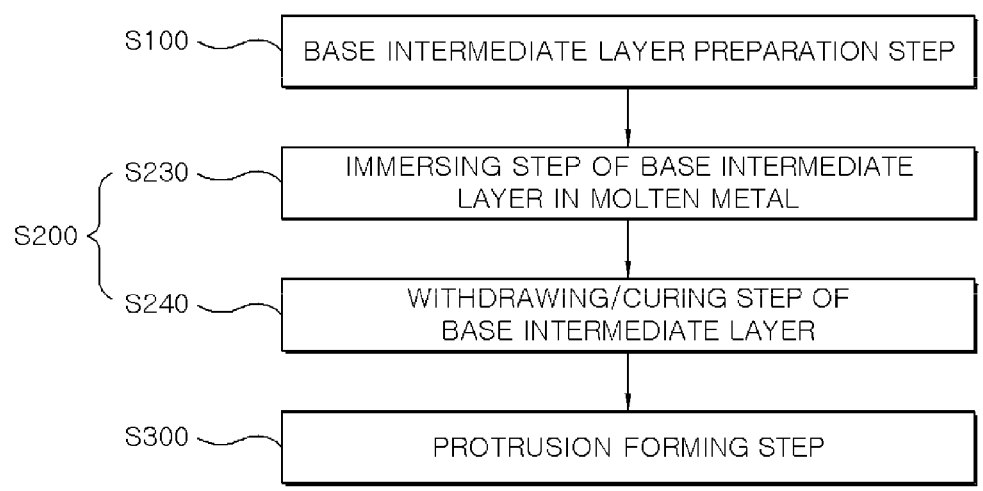
FIG. 5 shows another manufacturing example of a base substrate of the present disclosure.

Another manufacturing example of the base substrate of the present disclosure will be described in FIG. 5.

After the base intermediate layer preparation step (S100), the metal layer forming step (S200) may include the steps of immersing the base intermediate layer in the molten metal (S230), and withdrawing and curing the base intermediate layer from the molten melt (S240). Next, the first metal layer and the second metal layer may be respectively formed on both surfaces of the base intermediate layer. Then, the protrusion of the present disclosure may be formed in the center of the base substrate (S300).

The base substrate for an RF transistor of the present disclosure and a manufacturing method thereof may be used for any kind of transistors such as a metal-oxide semiconductor field-effect transistor (MOSFET), a lateral diffused metal-oxide semiconductor transistor (LDMOST), a bipolar junction transistor (BJT), a junction field-effect transistor (JFET), a heterojunction bipolar transistor (HBT) or the like, but the present disclosure is not limited thereto.

EXPLANATION OF REFERENCE SIGNS 10 base substrate
11 first metal layer
12 base intermediate layer
13 second metal layer
20 ceramic layer
30 lead frame
40 protrusion
50 die chip
60 wire

The invention claimed is:

1. A semiconductor package component comprising:
a base substrate;
a ceramic layer formed on an upper portion of the base substrate, a height of the ceramic layer being 0.4 mm to 0.7 mm;
a lead frame formed on an upper portion of the ceramic layer;
a die chip mounted on the upper portion of the base substrate; and
a protrusion formed on the base substrate, a height of the protrusion being 0.2 mm to 0.6 mm, wherein the die chip is mounted on the protrusion, and the die chip and the lead frame are connected with a wire.

2. The semiconductor package component according to claim 1, wherein the base substrate is formed in a multi-layer structure, and the base substrate formed in the multi-layer structure includes a first copper layer, a copper-molybdenum alloy layer formed on an upper portion of the first copper layer, and a second copper layer formed on the copper-molybdenum alloy layer.

3. The semiconductor package component according to claim 1, wherein the protrusion is in integral with the base substrate.

4. The semiconductor package component according to claim 1, wherein the height of the protrusion is lower than the height of the ceramic layer.

5. The semiconductor package component according to claim 4, wherein, when the height of the ceramic layer is r and the height of the protrusion is k, a ratio of r and k is 1:0.5 to 1:0.8.

6. The semiconductor package component according to claim 1, wherein the ceramic layer is formed in a shape that surrounds an outer periphery of the protrusion.

7. The semiconductor package component according to claim 1, wherein an area of the protrusion is larger than an area of the die chip.

8. The semiconductor package component according to claim 1, wherein the protrusion is not in contact with the ceramic layer.

9. The semiconductor package component according to claim 1, wherein the base substrate has a thermal expansion coefficient of 4 to 9 ppm/° C. and a thermal conductivity of 140 to 240 W/m·K.

10. The semiconductor package component according to claim 1, wherein the base substrate includes a first metal layer, a second metal layer and an intermediate layer, and the first metal layer and the second metal layer are bonded to the intermediate layer.

* * * * *